United States Patent
Hayashi et al.

(10) Patent No.: US 8,012,835 B2
(45) Date of Patent: Sep. 6, 2011

(54) METHOD OF HIGH VOLTAGE OPERATION OF FIELD EFFECT TRANSISTOR

(75) Inventors: Yutaka Hayashi, Tsukuba (JP); Hisashi Hasegawa, Chiba (JP); Yoshifumi Yoshida, Chiba (JP); Jun Osanai, Chiba (JP)

(73) Assignees: Seiko Instruments Inc. (JP); Yutaka Hayashi (JP)

( * ) Notice: Subject to any disclaimer, the term of this patent is extended or adjusted under 35 U.S.C. 154(b) by 48 days.

(21) Appl. No.: 12/283,639

(22) Filed: Sep. 12, 2008

(65) Prior Publication Data

US 2009/0014765 A1   Jan. 15, 2009

Related U.S. Application Data

(62) Division of application No. 11/063,388, filed on Feb. 22, 2005, now Pat. No. 7,545,018.

(30) Foreign Application Priority Data

Feb. 24, 2004 (JP) .................................. 2004-048667
Nov. 2, 2004 (JP) .................................. 2004-318751

(51) Int. Cl.
  *H01L 21/8234* (2006.01)

(52) U.S. Cl. ......... 438/275; 438/197; 438/200; 438/217

(58) Field of Classification Search ............. 438/197, 438/200, 217, 275
See application file for complete search history.

(56) References Cited

U.S. PATENT DOCUMENTS 3,999,210 A * 12/1976 Yamada .................. 257/364
5,208,477 A *  5/1993 Kub ........................ 257/421
7,545,018 B2 *  6/2009 Hayashi et al. ........ 257/500

* cited by examiner

*Primary Examiner* — Long Pham
(74) *Attorney, Agent, or Firm* — Adams & Wilks

(57) ABSTRACT

A high voltage operating field effect transistor has a source region and a drain region spaced apart from each other in a surface of a substrate. The source region is operative to receive at least one of a signal electric potential and a signal current. A semiconductor channel formation region is disposed in the surface of the substrate between the source region and the drain region. A gate region is disposed above the channel formation region and is operative to receive a bias electric potential having an absolute value equal to or larger than a first constant electric potential which changes according to an increase or decrease in a drain electric potential. A gate insulating film region is disposed between the channel formation region and the gate region.

6 Claims, 10 Drawing Sheets

METHOD OF HIGH VOLTAGE OPERATION OF FIELD EFFECT TRANSISTOR

CROSS-REFERENCE TO RELATED APPLICATIONS

This application is a divisional application of U.S. patent application Ser. No. 11/063,388 filed Feb. 22, 2005 now U.S. Pat. No. 7,545,018 and claiming a priority date of Feb. 24, 2004.

BACKGROUND OF THE INVENTION

1. Field of the Invention

The present invention relates to high voltage operating field effect transistors, bias circuits for them and high voltage circuits by them. The high voltage operating field effect transistor means a transistor which operates at a voltage an absolute value of which is larger than that of a withstand voltage of a transistor designed for a standard power supply voltage in an IC or an LSI.

2. Description of the Related Art

In a conventional high voltage field effect transistor, as shown in FIG. 1, a high withstand voltage drain region 380 is provided under a high withstand insulating film 480 and a field plate 580 biased at a high electric potential is provided on the high withstand insulating film 480 to improve a drain withstand voltage. When a gate length of a field effect transistor used [so as to comply with the standards] in an MOSIC or an MOSLSI becomes a small size equal to or smaller than submicron, as shown in FIG. 2, the field effect transistor is designed by providing with a lightly doped drain region called a lightly doped drain (LDD) or a drain extension 340 so as to withstand a standard power supply voltage. However, the high withstand voltage drain region requires an impurity concentration lower than that of the lightly doped drain, a length or depth larger than that of the lightly doped drain region, or both of them or all of them. For this reason, in JP 2002-314044 A, a high withstand voltage region is formed by combining three regions which are different in impurity concentration and junction depth from each other. Note that, in FIGS. 1 and 2, reference numeral 100 designates a semiconductor substrate, reference numeral 200 designates a source region, reference numeral 300 designates a drain region, reference numeral 400 designates a gate insulating film, and reference numeral 500 designates a conductive gate.

In this case, when the high withstand voltage field effect transistors are integrated into an IC or an LSI, photo masks and manufacturing processes for forming a high withstand voltage insulating film and a high withstand voltage drain region are excessively required, which leads to high cost. In addition, though increased high withstand voltage is possible for a transistor having such a structure, reduction of a driving current becomes a problem. Also, while a channel length of a field effect transistor for a standard voltage having the drain extension structure or the LDD structure can be increased to improve the withstand voltage, a degree of the improvement is low, and the driving current decreases nearly inversely proportional to the channel length. When a gate insulating film of this field effect transistor for a standard voltage is used, the withstand voltage of the field effect transistor is limited by a withstand voltage as well of this insulating film. Moreover, in case of a transistor which is formed in a semiconductor thin film on an insulating substrate such as a silicon on insulator (SOI), a high electric field is concentrated in the thin film at a drain end of a channel. Thus, increasing a drain withstand voltage and maintaining a large output current by using the related art are much more difficult than those in the case of the transistor formed in the semiconductor substrate.

SUMMARY OF THE INVENTION

In light of the foregoing, it is an object of the present invention to form a high voltage operating field effect transistor in an IC or an LSI by utilizing a transistor structure portion or a process technique for a standard transistor operating under a standard power supply voltage in the IC or in the LSI.

In order to attain the above-mentioned object, in the present invention, measures are taken in which a gate between a source and a drain is divided into division gates, and electric potentials each of which is closer to a drain electric potential and each of which changes according to increase or decrease in the drain electric potential, are supplied to the division gates nearer the drain, respectively, in order to increase an operating voltage of a field effect transistor (hereinafter referred to "a high voltage operating field effect transistor" in the present invention).

A construction of a first solving means is as follows.

That is, a high voltage operating field effect transistor includes at least:

a substrate;

a source region and a drain region which are spaced apart from each other in a surface of the substrate;

a semiconductor channel formation region provided in the surface of the substrate between the source region and the drain region;

a plurality of division gates provided above the channel formation region, the plurality of division gates being obtained through division in a source/drain direction; and a plurality of gate insulating films provided between the channel formation region and the plurality of division gates, in which a signal electric potential is supplied to the division gate nearest the source region of the plurality of division gates, and bias electric potential (s) each of which has an absolute value equal to or larger than a specified electric potential, each of which changes according to increase or decrease in a drain electric potential, and each absolute value of which becomes larger to each of the division gates nearer to the drain region are supplied to the division gate(s) which is (are) nearer the drain region than the division gate nearest the source region is, respectively.

Further, a first modification described below can be employed to improve frequency characteristics.

That is, in the high voltage operating field effect transistor according to the first solving means, the number of the division gates is equal to or larger than three, a first constant electric potential is supplied to the division gate located on a drain region side with respect to the division gate nearest the source region, and bias electric potential (s) each of which changes according to increase or decrease in the drain electric potential and which has (have) larger absolute values towards the drain region is (are) supplied to the division gate(s) nearer the drain region, respectively.

In this structure, a conventional signal electric potential Vg is supplied to a division gate G1 nearest the source region. Electric potentials up to a bias electric potential Vd1 each of which is equal to or higher than the signal electric potential Vg or a first constant electric potential Vs1, each of which is nearer a drain electric potential Vd than a source electric potential Vs, and each of which changes according to increase or decrease in the drain electric potential is supplied to division gates G2, G3, ..., Gk, respectively, which are located on the drain side with respect to the division gate nearest the source region. Electric potentials absolute values of which become larger towards the drain region are supplied to the division gates, respectively.

The first constant electric potential Vs1 is equal to or lower than a power supply electric potential for an IC or an LSI. In the present invention, the signal electric potential Vg and the first constant electric potential Vs1 are collectively called a specified electric potential.

Each of the electric potentials supplied to the division gates G2, G3, . . . , Gk which are located on the drain side with respect to the division gate G1 nearest the source region, when the drain electric potential Vd becomes equal to or lower in absolute value than the specified electric potential, can be held equal to or higher than the specified electric potential to prevent a decrease in driving current value in the low drain electric potential.

In the present invention, each of such electric potentials supplied to the division gates G2, G3, . . . , Gk is called "a bias electric potential which is equal to or higher in absolute value than the specified electric potential and which changes according to increase or decrease in the drain electric potential". The electric potential supplied to the division gate Gk is designated with Vd1.

The electric potential Vd1 supplied to the division gate Gk nearest the drain region is an electric potential near the drain electric potential Vd. Then, even when the electric potential Vd1 is equal to or lower than Vd, or even when the electric potential Vd1 is equal to or higher than Vd, the effect is obtained unless the electric potential Vd1 is extremely different from Vd. Since the channel electric potential under the division gate which is located on the source side with respect to the division gate Gk nearest the drain region comes to decrease below Vd1 towards the source region, the operating voltage is improved all the more as compared with a case of a single gate standard transistor structure.

In order to employ the gate insulating film for the standard transistor within an IC or an LSI, in the transistor of the present invention, a degree of a value obtained by adding the design margin to the power supply voltage at which the standard transistor operates is permitted for a difference between Vd and Vd1. Normally, two kinds of standard transistors, i.e., a standard transistor for internal logic and a standard transistor for the external interface are prepared in many cases. Thus, when the high voltage operation has precedence over the current capacity, it is possible to apply the gate insulating film thickness and voltage for an external interface.

A high voltage operating transistor of a second solving means, in which the source region of the first solving means is used as a place where the signal is to be supplied, has the following construction.

That is, a high voltage operating field effect transistor includes at least:

a substrate;

a source region and a drain region which are spaced apart from each other in a surface of the substrate;

a semiconductor channel formation region provided in the surface of the substrate so as to be held between the source region and the drain region;

a plurality of division gates provided above the channel formation region, the plurality of division gates being obtained through division in a source/drain direction; and a plurality of gate insulating films provided between the channel formation region and the plurality of division gates, in which at least one of a signal electric potential and a signal current is supplied to the source region, a first constant electric potential is supplied to the division gate nearest the source region of the plurality of division gates, and bias electric potentials each of which has an absolute value equal to or larger than the first constant electric potential, each of which changes according to increase or decrease in a drain electric potential, and the absolute values of which become larger towards the drain region are supplied to the division gates which are nearer the drain region than the division gate nearest the source region, respectively.

The high voltage operating field effect transistor according to a first modification of the second solving means has the following structure.

That is, a high voltage operating field effect transistor includes at least:

a substrate;

a source region and a drain region which are spaced apart from each other in a surface of the substrate;

a semiconductor channel formation region provided in the surface of the substrate so as to be held between the source region and the drain region;

a gate provided above the channel formation region; and a gate insulating film provided between the channel formation region and the gate, in which at least one of a signal electric potential and a signal current is supplied to the source region, and a bias electric potential which has an absolute value equal to or larger than the first constant electric potential and which changes according to increase or decrease in a drain electric potential is supplied to the gate.

In the first solving means and the first modification, and the second solving means, when the distance between the adjacent division gates is large, the current may be reduced or the operation may become unstable in some cases. In order to avoid this state, the following construction is adopted. That is, in the high voltage operating field effect transistor according to any one of the first solving means and the first modification, and the second solving means, intermediate regions each having the same conductivity type as that of channel carriers are provided in the channel formation region portion between the plurality of division gates, respectively.

However, when impurities are added to the channel formation region to convert the channel formation region into a depletion channel, and when as a result the current capacity becomes no problem, the intermediate region can be omitted.

When the distance between the adjacent division gates is nearly equal to or shorter than the gate length, the intermediate region can be formed through the LDD or drain extension process used in the standard transistor, and hence the process for forming a high impurity concentration drain region can be made unnecessary for the intermediate region.

There is no need to provide an interconnection formed of a conductive thin film to the intermediate region, and hence there is also no need to provide a contact for the interconnection. When the current capacity meets the specification, there is no need to add impurities to the intermediate region at the same impurity concentration as that of the high impurity concentrated drain region in order to only reduce the contact resistance.

For this reason, even if the intermediate region is provided, the high voltage operating field effect transistor has a simple structure and a small occupation area as compared with the structure in which a plurality of the standard transistors are series-connected each other.

The bias electric potential supplied to the gate of the second solving means is also the same as that in the first solving means except that in the gate electric potential supplied to the gate of the first solving means, the specified electric potential are set as the first constant electric potential. The bias circuit for generating electric potentials to be supplied to the division gates or the gate of the first and second solving means (hereinafter referred to as "the bias circuit" for short) will be described in "DESCRIPTION OF THE PREFERRED EMBODIMENTS" section. However, bias circuits and high voltage operation circuit elements which will be described can be applied not only to the high voltage operating field effect transistors disclosed above but also generally to a high voltage operating field effect transistor with a drain, a source and a plurality of division gates being obtained between the drain and the source through division in a source/drain direction.

The electric potential biases supplied to the respective division gates can be generated through the resistance division or the like as exemplified in FIG. 3. However, there is no guarantee that the same values of the electric potential biases as the steady-state values can be generated during the transient response because of influences caused by used resistors and a parasitic capacitances with interconnections and the like. For this reason, a capacitive element having a capacitance value overcoming the influence of the parasitic capacitance is connected from the drain region (300) to a series connection end 60-$k$ to which the electric potential Vd1 is supplied whereby an electric potential change required for the division gate Gk nearest the drain region can be ensured during the transient response as well.

This structure becomes equivalent to a case where a capacitive element is connected between the drain region and the division gate nearest the drain region through an interconnection from the series connection end 60-$k$ to the division gate Gk, or through another element when this element such as a resistor is connected between the series connection end 60-$k$ and the division gate Gk. In the present invention, it is complicated that all the capacitive elements for a measure for the transient response are described in the various kinds of bias circuits. Thus, the wording "the capacitive element is connected between the drain region and the division gate nearest the drain region" is described as long as there are obtained the results in which the capacitive element is topologically directly or indirectly connected between the drain region of the high voltage operating transistor of the present invention and the division gate nearest the drain region.

In the case as well of the high voltage operating transistor having one gate of the first modification of the second solving means, the direct or topologically equivalent connection is described as the wording "the capacitive element is connected between the drain region and the gate".

The ensuring of the transient response is also required for other division gates. In order to attain this, the capacitive element is topologically directly or in the form of being incorporated in the bias circuit between the drain region and at least one of the division gates. In the present invention, similarly to the foregoing, in order to avoid the complicatedness, this state is described as the wording "the capacitive element is connected between the drain region and at least one of the division gates". However, when the signal electric potential is supplied to the division gate nearest the source region, no capacitive element is connected to the division gate nearest the source region.

This capacitive element having a relatively smaller capacity value is selected for the division gate as this division gate is more distant from the drain region.

Likewise, in order to ensure the transient response, the capacitive element is topologically directly or in the form of being incorporated in the bias circuit between the division gates including the division gate nearest the drain region. In the present invention, this state is collectively described as the wording "the capacitive element is connected between at least one pair of division gates among the division gates". However, when the signal electric potential is supplied to the division gate nearest the source region, no capacitive element is connected to the division gate nearest the source region at all. On the other hand, in the case of the second solving means, since the signal is directly inputted to neither of the gates, the capacitive element can be connected to any of gates.

When the capacitive element is directly connected between the division gates two by two, an inverse ratio in steady-state electric potential between the division gates for connection is set so as to be nearly equal to a ratio in capacitive value between the capacitive elements in many cases. When the bias circuit supplies the bias electric potential through the resistance division, in order to obtain the matching between time constants, a ratio in inverse number between the division resistances is set as a ratio in capacitive value between the capacitive elements in many cases.

When the capacitive element is connected between the drain region and the gate or the division gate, or between the division gates in such a manner, the absolute value of the electric potential at the division gate or the gate becomes transiently smaller than the first constant electric potential Vs1 in some cases. In order to avoid this state, one terminal of a rectifying device is connected to the division gate or the gate, and the second constant electric potential can be supplied to the other terminal of the rectifying device. An absolute value of the second constant electric potential is set as a value which is obtained by adding a forward voltage of the rectifying device to the absolute value of the first constant electric potential in many cases.

A MOS structure capacitor, or a pn junction capacitor can be used for the capacitive element. A pn junction, and a field effect transistor having a drain and a gate connected to each other, or the like can be used as the rectifying device.

A semiconductor substrate can be used as the substrate in which the high voltage operating field effect transistor of the present invention is formed.

Also, a substrate in which a semiconductor thin film insulated from a supporting substrate is provided on a surface of the supporting substrate can be used as the substrate in which the high voltage operating field effect transistor of the present invention is formed.

Of the high voltage operating circuits to each of which the high voltage operating field effect transistor of the present invention is applied, in order that suitable one may be used in the bias circuit as well for the high voltage operating field effect transistor of the present invention, the following first high voltage operating circuit element is favorable. That is, a high voltage operating circuit element including at least:

a first insulated gate field effect transistor;

a second field effect transistor complementary to the first insulated gate field effect transistor;

a first resistor having one end connected to a drain of the first insulated gate field effect transistor; and a second resistor having one end connected to a source of the first insulated gate field effect transistor, in which: a first electric potential is supplied to the other end of the first resistor, and a second electric potential is supplied to the other end of the second resistor; the second field effect transistor is the high voltage operating field effect transistor of the present invention, and includes at least two division gates; a source of the second field effect transistor is connected to the drain of the first insulated gate field effect transistor; a division gate nearest a source region of the second field effect transistor is connected to the source of the first insulated gate field effect transistor; the second electric potential is supplied to a division gate nearest a drain region of the second field effect transistor; a gate of the first insulated gate field effect transistor is set as an input; and an output is taken out from one place selected from the source and the drain of the first insulated gate field effect transistor.

Of the high voltage operating circuits to each of which the high voltage operating field effect transistor of the present invention is applied, in order that suitable one may be used in the bias circuit as well for the high voltage operating field effect transistor of the present invention, the following second high voltage operating circuit element is favorable. That is, a high voltage operating circuit element, including at least:

a first insulated gate field effect transistor;

a second field effect transistor complementary to the first insulated gate field effect transistor;

a first resistor having one end connected to a drain of the first insulated gate field effect transistor; and a second group of plural serial-connected resistors having one end of a series connection end portion connected to a source of the first insulated gate field effect transistor, in which: the second field effect transistor is the high voltage operating field effect transistor of the present invention, and includes at least three division gates; a source of the second field effect transistor is connected to the drain of the first insulated gate field effect transistor; the division gates are connected to places selected from nodes and one end of the series connection end portion of the second group of plural serial-connected resistors, respectively; the other end of the first resistor is connected to a first electric potential; a second electric potential is supplied to the other end of the series connection end portion of the second group of plural serial-connected resistors; a gate of the first insulated gate field effect transistor is set as an input; and an output is taken out from one place selected from the source and the drain of the first insulated gate field effect transistor, and the nodes of the second group of plural serial-connected resistors.

In order to ensure the transient response characteristics of the first and second high voltage operating circuit elements described above, the capacitive element can be connected between the gate and the source of the first insulated gate field effect transistor.

In order to ensure the transient response characteristics of the first and second high voltage operating circuit elements described above, the capacitive element can be connected between the input, and one of the source of the first insulated gate field effect transistor and the output.

In order to ensure the transient response characteristics of the first and second high voltage operating circuit elements as described above, the capacitive element can be connected between the two points selected from the series connection ends and nodes of the second group of plural serial-connected resistors. In this case, when the capacitive element is connected between the division gates of the second field effect transistor, the same effects can be expected.

The effects of the present invention are as follows:

1. The high voltage operating field effect transistor can be realized by adoption of a cross sectional structure of the transistor developed for the standard voltage, and addition of few fabrication processes without forming the high withstand voltage structure having a special cross sectional structure in the transistor (the change of the planar pattern is necessary).

Note that if the combination with the conventional high withstand voltage cross sectional structure is possible, the high voltage operating field effect transistor can operate at a higher voltage.

2. Both the high voltage operation and the driving current can be improved as compared with the transistor the channel length of which is lengthened to improve its withstand voltage.

3. While the bias circuit is required, the high voltage operating field effect transistor can be realized through the manufacturing process prepared for the standard voltage IC. Even if there is a modification, the high voltage operation can be realized by addition of few modifications.

4. If there is an output transistor (normally having a higher voltage than the internal voltage) for the standard voltage IC or LSI, the insulating film which is already prepared for the output transistor can be diverted to the gate insulating film.

5. Consequently, the IC able to output a high voltage can be manufactured through the normal IC manufacturing line.

6. The field effect transistor which is formed in a semiconductor thin film and typified by a TFT in an SOI substrate, on a glass substrate, or on an organic substrate and which is conventionally difficult to carry out a high voltage operation ensuring the current capacity can operate at the high voltage.

7. The standard voltage signal area and the high voltage operating area can be separated from each other within the IC or LSI chip by introducing the second solving means of the present invention. Thus, it is possible to avoid a danger that the high voltage interconnections are formed within the low voltage operating area, and it is also possible to suppress a signal delay by transmitting the standard voltage signal up to the high voltage operating area with low amplitude.

BRIEF DESCRIPTION OF THE DRAWINGS

In the accompanying drawings:

FIG. 12 is a schematic circuit diagram showing Embodiment 8 of a bias circuit of the present invention;

DESCRIPTION OF THE PREFERRED EMBODIMENTS

A description of preferred embodiments of the present invention will hereinafter be mainly given with respect to a case where an n-channel high voltage operating field effect transistor is mainly assumed. If a sign of a voltage relationship is inverted between plus and minus, absolute values are applied to magnitude relationships, and an n type conductivity is inverted to a p type conductivity, this can also be applied to a p-channel field effect transistor.

Figure 1:
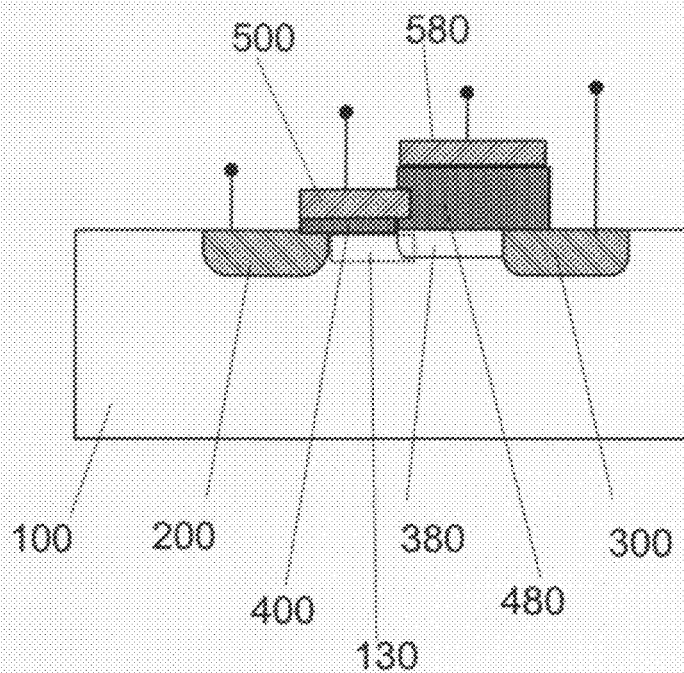
FIG. 1 is a schematic cross sectional view showing a structure of a conventional high withstand voltage MOS transistor.
Figure 2:
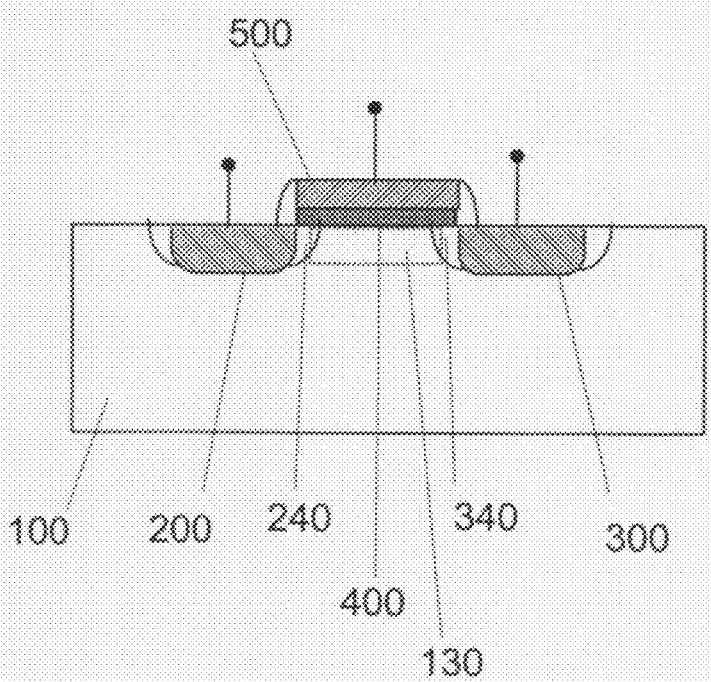
FIG. 2 is a schematic cross sectional view showing a structure of a MOS transistor having a gate length of a small size.
Figure 3:
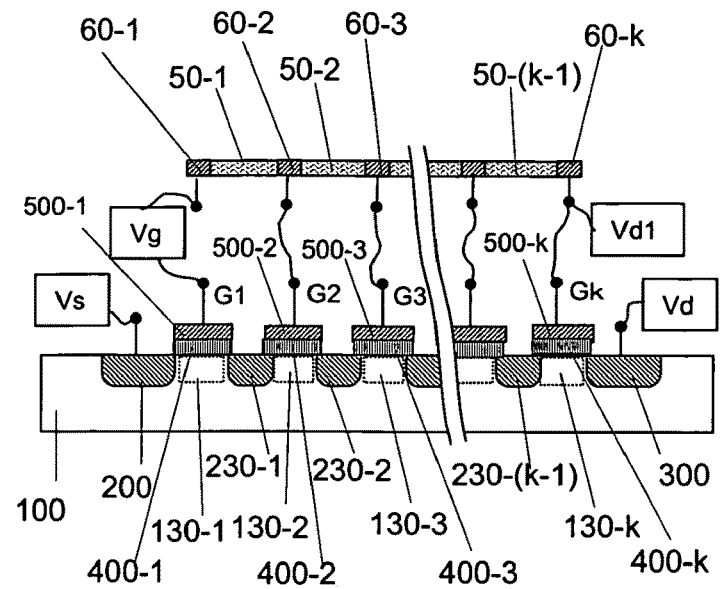
FIG. 3 is a schematic cross sectional view showing a structure of an example of a field effect transistor and a bias circuit for explaining first solving means with the intermediate regions and an example of a biasing method of the present invention.

In Embodiment 1 of the present invention, as shown in FIG. 3, a gate region comprises a plurality of division conductive gates 500-1, 500-2, . . . , 500-$k$ (corresponding to G1, G2, . . . , Gk described above) (k is an integral number equal to or larger than 2) which are obtained through division in a source/drain direction are provided above semiconductor channel formation region 130 (130-1, 130-2, 130-3, - - -, 130-$k$) held between a source region 200 and a drain region 300 provided in a surface of a substrate 100. A gate insulating film region comprising a plurality of gate insulating films 400-1, 400-2, . . . , 400-$k$ are provided between the channel formation region 300 and the division gate 500 (500-1, 500-2, 500-3, - - -, 500-$k$).

A signal electric potential is supplied to the division gate 500-1 nearest the source region 200 of the plurality of division gates. Also, bias electric potentials each of which changes according to increase or decrease in a drain electric potential and absolute values of which become larger towards the drain region 300 are supplied to the division gates which are nearer the drain region 300 than the division gate 500-1 which are nearer the source region 200.

If the distance between the adjacent division gates is large, the channel resistance between the division gates becomes large and the operation becomes unstable in some cases. Hence, intermediate regions 230-1, . . . , 230-($k$–1) each having the same conductivity type as that of the channel carriers are provided in the channel formation regions between the division gates, respectively, in many cases. The provision of the intermediate regions 230-1, . . . , 230-($k$–1) divides the channel formation region 130 into the channel formation regions 130-1, 130-2, . . . , 130-$k$.

When each of the source region 200 and the drain region 300 is made of a semiconductor, these intermediate regions can be formed through the same process as that of the formation of the source region 200 and the drain region 300. When the MOSIC manufacturing process having the various processings includes the drain extension or LDD process, this may also be applied thereto.

In the structure of the division gates, the conventional signal electric potential Vg is supplied to the division gate 500-1 (G1) nearest the source region 200. The electric potentials each equal to or higher than the signal electric potential Vg or the first constant electric potential Vs1, but are equal to or lower than the bias electric potential Vd1 are supplied to the division gates 500-2(G2), . . . , 500-$k$(Gk) nearer the drain side than the division gate 500-1 nearest the source region 200 is, respectively. The electric potentials absolute values of which become larger towards the drain region 300 are supplied to the division gates which are nearer the drain region 300 than the division gate 500-1 nearest the source region 200 is, respectively.

But, each of the absolute values of the electric potentials supplied to the division gates 500-2(G2), . . . , 500-$k$(Gk) which are nearer the drain side than the division gate 500-1 nearest the source region 200 is controlled so as to become equal to or higher than the specified electric potential (the signal electric potential Vg or the first constant electric potential Vs1), thereby preventing the driving current value from decreasing at a low drain electric potential.

The electric potential Vd1 supplied to the division gate 500-$k$(Gk) nearest the drain region 300 is an electric potential nearer Vd. Thus, even when the electric potential Vd1 is equal to or lower or higher than Vd, the effects can be obtained unless the electric potential Vd1 is extremely different from Vd.

Since the channel electric potentials under the division gates which are nearer the source side than the division gate 500-$k$(Gk) nearest the drain region 300 is become lower in the absolute value than Vd towards the source region 200, the operating voltage is improved all the more as compared with the case of the standard transistor structure.

About a value which is obtained by adding the design margin to the power supply voltage at which the standard transistor operates is permitted for a difference between Vd and Vd1. Two kinds of transistors, i.e., a transistor for internal logic and a transistor for an external interface are prepared for the standard transistor in many cases. Hence, in such cases, a thickness of a gate insulating film of the transistor for the external interface is applied to the gate insulating films of the high voltage operating field effect transistor of the present invention, and the value which is obtained by adding the design margin to the power supply voltage prepared for the transistor for the external interface is applied to the allowable voltage difference between Vd and Vd1, whereby it is possible to widen the operating voltage range of the present invention.

An example of a structure for supplying these electric potentials to the respective division gates is shown in FIG. 3. Resistors 50-1, 50-2, . . . , 50-($k$–1) are connected in series with one another, and electric potentials V2, . . . , Vk are supplied from the nodes 60-2, . . . , 60-$k$ to the division gates 500-2 (G2), . . . , 500-$k$(Gk), respectively.

Vg is supplied to the node 60-1, and Vd1 is supplied to the node 60-$k$.

In the present invention, the resistor does not necessarily have the linear current-voltage characteristics. In addition, the bias electric potentials can be generated not only through the electric potential division using the resistor, but also by active elements such as transistors in an IC.

In order to increase an input impedance of the high voltage operating field effect transistor of the present invention, the electric potentials V2, V3, . . . , Vk (k≧2), i.e., a voltage between the first constant electric potential Vs1, which is equal to or lower than the power supply voltage used in an IC or an LSI, and the bias electric potential Vd1 can be supplied to the division gates 500-2(G2), . . . , 500-$k$(Gk), respectively. At this time as well, similarly to the foregoing, the electric potentials the absolute values of which become larger towards the drain region 300 are supplied to the division gates which are nearer the drain region 300 than the division gate 500-1 nearest the source region 200 is, respectively. When Vd1 becomes lower in absolute value than Vs1, Vs1 is supplied to each of the division gates 500-2 (G2), . . . , 500-$k$(Gk). In this case, Vs1 is supplied instead of Vg to the node 60-1, while Vg is supplied to 500-1 and Vd1 is supplied to the node 60-$k$, when Vd1 in the absolute value is larger than Vs1. In the present invention, the terminal (one end or the other end) of a series connection portion may also be referred as "the node" in some cases.

In order to further increase the high frequency input impedance, as Modification 1 of Embodiment 1 according to the present invention, the electric potential V2 supplied to the division gate 500-2(G2) located on the drain region side with respect to the division gate 500-1(G1) which is adjacent thereto and nearest the source region 200 can be fixed to the first constant electric potential Vs1. In this case as well, the effect of improving the withstand voltage is offered. In FIG. 3, in this case, the first constant electric potential Vs1 is applied to the division gate 500-2(G2) and to the node 60-2 and hence the resistor 50-1 and the node 60-1 become unnecessary. In Modification 1, the number of division gates is equal to or larger than three.

In order to further improve the high frequency characteristics, a capacitive element (an element having a capacitive component, e.g., a pn junction or a MIS capacitor) can be connected between the division gate 500-2(G2) and an AC grounding point.

In order to improve the transient response of the bias voltage applied to the division gate 500-$k$ nearest the drain region 300, a capacitive element can be connected between the drain region 300 and the node 60-$k$.

In order to improve the transient response of the bias voltages applied to the respective division gates, a capacitive element can be connected between the drain region 300 and at least one of the nodes 60$k$, 60-($k$–1), . . . , 60-3. The capacitive elements are desirably connected between the drain region 300, and all the nodes 60$k$, 60-($k$–1), . . . , 60-3. In this case, when parasitic capacitance values when viewed from the respective nodes are nearly equal to one another, the capacitance values are decreased in descending order of reference numerals of the nodes so that the capacitance value between the drain region 300 and the node 60-($k$–1) is smaller than that between the drain region 300 and the node 60-$k$, and so forth.

In order to improve the transient response of the bias voltages applied to the respective division gates, a capacitive element can be connected between at least two nodes or the adjacent nodes of the nodes 60-$k$, 60-($k$–1), . . . , 60-2. It is desirable that a capacitive element be connected between the drain region 300 and the node 60-$k$, and moreover, capacitive elements are connected between the adjacent nodes two by two of the nodes 60-$k$, 60-($k$–1), . . . , 60-2. A ratio in capacitance value of the capacitive elements connected between the adjacent nodes two by two is selected so as to be nearly equal to [that] the inverse ratio of resistance value of the resistors 50-($k$–1), . . . , 50-2.

In these cases, the absolute value of the electric potential at the node becomes lower than the first constant electric potential Vs1 in some cases. In order to avoid this state, one end of a rectifying device can be connected to the node, and a second constant electric potential can be supplied to the other end of the rectifying device. An absolute value of the second constant electric potential is set to a value which is obtained by adding a forward voltage of the rectifying device to the absolute value of the first constant electric potential in many cases.

A mode of connection of the capacitive element to the bias circuit becomes topologically equal to:

the wording "the capacitive element is connected between the drain region and the division gate nearest the drain region", the wording "the capacitive element is connected between the drain region and at least one of the division gates", the wording "the capacitive element is connected between at least one pair of division gates of the division gates", and the wording "one end of the rectifying device is connected to the division gate, and the second constant electric potential is supplied to the other end of the rectifying device".

As Embodiment 2 of the present invention, the following structure can be provided. That is, a high voltage operating field effect transistor includes at least:

a substrate;

a source region and a drain region which are spaced apart from each other on a surface of the substrate;

a semiconductor channel formation region provided in the surface of the substrate so as to be held between the source region and the drain region;

a plurality of division gates provided above the channel formation region, the plurality of division gates being obtained through division in a source/drain direction; and a plurality of gate insulating films provided between the channel formation region and the plurality of division gates, in which at least one of a signal electric potential and a signal current is supplied to the source region, a first constant electric potential is supplied to the division gate nearest the source region of the plurality of division gates, and bias electric potentials each of which has an absolute value equal to or larger than the first constant electric potential, each of which changes according to increase or decrease in a drain electric potential, and the absolute values of which become larger towards the drain region are supplied to the division gates which are nearer the drain region than the division gate nearest the source region is, respectively.

A high voltage operating field effect transistor in Modification 1 of Embodiment 2 according to the present invention includes at least:

a substrate;

a source region and a drain region which are spaced apart from each other on a surface of the substrate;

a semiconductor channel formation region provided in the surface of the substrate so as to be held between the source region and the drain region;

a gate provided above the channel formation region; and a gate insulating film provided between the channel formation region and the gate, in which at least one of a signal electric potential and a signal current is supplied to the source region, and a bias electric potential which has an absolute value equal to or larger than the first constant electric potential, and which changes according to increase or decrease in a drain electric potential.

The source of the high voltage operating field effect transistor of Embodiment 2 and Modification 1 of the present invention is connected to the drain of the standard transistor provided inside an IC or an LSI through a conductive interconnection, whereby the standard voltage signal can be converted into the high voltage operating signal.

Moreover, the standard voltage signal area and the high voltage operating area can be separated from each other. Thus, it is possible to avoid the danger that the high voltage interconnections are formed within the low voltage operating area, and it is possible to suppress the signal delay because the standard voltage signal can be transmitted up to the high voltage operating area with a low amplitude.

In order to attain this, the first constant electric potential is selected as the specified electric potential in the gate bias electric potential of the high voltage operating field effect transistor of Embodiment 2.

In the second solving means as well, when the distance between the adjacent division gates is large, the channel resistance between the adjacent division gates becomes large and the operation becomes unstable in some cases. Thus, intermediate regions each having the same conductivity type as that of the channel carriers are provided in the channel formation region between the division gates two by two. The channel formation region is divided by those intermediate regions.

The process for manufacturing the standard IC or LSI which can be applied to the intermediate region formation is the same as that in the first solving means.

The bias electric potentials supplied to the division gates of Embodiment 2 and the gate of Modification 1 thereof are also the same as the division gate electric potentials supplied to the division gates of the first solving means.

The improvement in the transient response characteristics of the bias electric potentials supplied to the division gates of Embodiment 2 and the gate of Modification 1 thereof due to the connection of the capacitive element is also the same as that in the case of Embodiment 1. In the case of Modification 1 of Embodiment 2, the wording "the division gate nearest the drain region" is replaced with "the gate".

The bias electric potential Vd1 increases or decreases in accordance with an increase or a decrease of Vd. However, Vd1 and Vd do not need to have a linear relationship.

Note that when there are a plurality of power supply voltages, the voltage with which the driving current value and the withstand voltage become optimal is utilized as Vs1. At this time, there is used a gate insulating film the thickness of which is prepared in the process for manufacturing an IC or an LSI so as to withstand that voltage.

The present invention can also be applied to the transistor having the LDD or drain extension structure.

The present invention is applied to a high voltage operating field effect transistor formed in a semiconductor substrate, a high voltage operating field effect transistor formed in a so-called semiconductor-on-insulating (SOI) substrate having a semiconductor thin film formed on an insulated surface of a supporting substrate, a glass substrate, an organic sheet or the like, and a high voltage operating field effect transistor formed in a semiconductor-on-nothing (SON) having a semiconductor thin film insulated from a support substrate held over a cavity from the left- and right-hand sides.

There are many kinds of bias electric potential generating circuits for the high voltage operating field effect transistor of the present invention (hereinafter referred to as "a bias circuit" for short). Embodiments of the bias circuit will hereinafter be disclosed. Since the connection of the capacitive element and the connection of the rectifying device for the improvement in the transient response characteristics have already been described in Embodiments 1 and 2 each having the resistor division shown in FIG. 3, no repeated description will be given with respect to the individual circuits.

First of all, a description will hereinafter be given with respect to a circuit for generating the bias electric potential (Vd1) for the division gate 500-$k$ nearest the drain region 300 or the gate of Modification 1 of Embodiment 2. The bias electric potentials which are obtained through the electric potential division of the electric potential between the bias electric potential Vd1 and the specified electric potential can be supplied as the bias electric potentials for other division gates.

Embodiment 1 of a bias circuit includes at least an adder having at least two inputs and one output, in which an electric potential which changes according to increase or decrease in a drain electric potential is supplied to one of the two inputs, and a specified electric potential Vs1$g$ is supplied to the other of the two inputs; and an electric potential of the output of the adder is supplied as a bias electric potential to the division gate nearest the drain region or the gate of Modification 1 of Embodiment 2.

Figure 4:
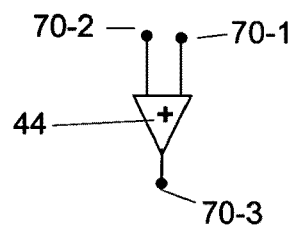
FIG. 4 is a schematic circuit diagram showing Embodiment 1 of a bias circuit of the present invention.

As shown in FIG. 4, an adder 44 is an analog operational circuit for outputting a sum of electric potentials applied to input terminals 70-1 and 70-2, respectively, to an output terminal 70-3. Thus, when an electric potential Vd2 which changes according to increase or decrease in a drain electric potential, and Vg are supplied to one terminal 70-1 and the other terminal 70-2, respectively, the adder 44 outputs an electric potential of Vg+Vd2 (=Vd1) to the output terminal 70-3. Thus, this bias electric potential Vd1 is supplied to the division gate nearest the drain region through the output terminal 70-3.

In Embodiment 1 of the bias circuit described above, even when the first constant electric potential Vs1 is supplied instead of Vg to the other input terminal 70-2 of the adder 44, the bias electric potential can be supplied to the division gate nearest the drain region of the high voltage operating field effect transistor of the present invention or the gate of Modification 1 of Embodiment 2. In this case, a relationship of Vd1=Vs1+Vd2 is established.

A high voltage power supply of the high voltage operating field effect transistor of the present invention is diverted to a power supply of the adder 44 in many cases. The technique of the present invention is applied to a transistor as well constituting this analog operational circuit 44, thereby allowing the high voltage to be outputted.

Figure 5:
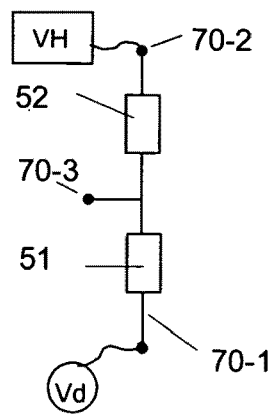
FIG. 5 is a schematic circuit diagram showing Embodiment 2 of a bias circuit of the present invention.

Embodiment 2 of a bias circuit having a simpler element configuration than that of the bias circuit of Embodiment 1 for supplying an electric potential to the division gate nearest the drain region of the high voltage operating field effect transistor of the present invention or the gate of Modification 1 of Embodiment 2 is shown as an example in FIG. 5. As apparent from FIG. 5, the bias circuit of Embodiment 2 includes at least two serial-connected resistors 51 and 52, in which an electric potential is supplied from the high voltage power source to one terminal 70-2 of the serial-connected two resistors 51 and 52, and the other terminal thereof is connected to a drain region; and a bias electric potential is supplied from a node 70-3 between the serial-connected two resistors 51 and 52 to the division gate nearest the drain region or the gate of Modification 1 of Embodiment 2.

Note that in FIG. 5, reference symbol VH designates a high voltage power source electric potential, and a value in which VH×(the resistance value of the resistor on the drain side)/ (the resistance value of the serial-connected two resistors) becomes the first constant electric potential Vs1 is normally selected as a resistance value of the serial-connected two resistors.

Figure 6:
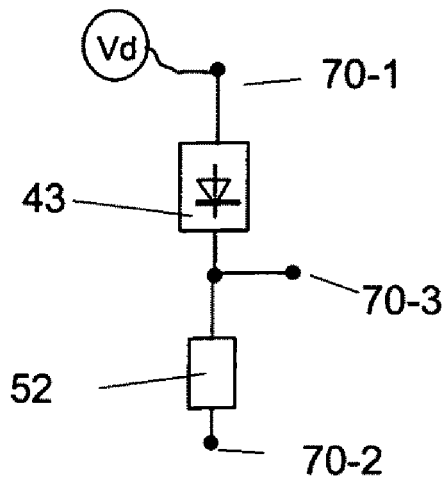
FIG. 6 is a schematic circuit diagram showing Embodiment 3 of a bias circuit of the present invention.

In Embodiment 2 of the bias circuit, a current is caused to flow from the high voltage source to the drain. This state becomes a problem depending on the resistance values of the resistors in some cases. Embodiment 3 of a bias circuit which is free from the current flowing into the drain and which serves to supply an electric potential to the division gate nearest the drain region of the high voltage operating field effect transistor of the present invention or the gate of Modification 1 of Embodiment 2 is shown as an example in FIG. 6. As apparent from FIG. 6, Embodiment 3 of the bias circuit includes at least a rectifying device 43 and a resistor 52 connected in series with each other, in which a series connection end 70-1 on a rectifying device side is connected to the drain region; the specified electric potential is supplied to a series connection end 70-2 on a resistor side; and a bias electric potential is supplied from a node 70-3 between the rectifying device 43 and the resistor 52 to the division gate nearest the drain region. When the bias electric potential is supplied to the gate of Modification 1 of Embodiment 2, the specified electric potential is set as the first constant electric potential.

In Embodiment 3, to be specific, the rectifying device 43 is realized in the form of a pn junction diode, a Schottky diode, an equivalent rectifying device formed by connecting a drain and a gate of an insulated gate field effect transistor, or the like. The rectifying device 43 is provided in order to prevent the absolute value of the supplied electric potential from decreasing to a level equal to or lower than |Vg| or |Vs1| when the drain electric potential decreases to the vicinity of the grounding electric potential.

While the addition of the specified electric potential (Vg or Vs1) to the electric potential supplied to the series connection end 70-1 is omitted for the sake of simplicity, when a relationship of Vd>>Vg is established in this case, the high withstand voltage effect sufficiently appears. When the electric potential at the series connection end 70-1 becomes equal to or lower than the specified electric potential plus Vf in the case where the addition of the specified electric potential is omitted, the electric potential at the node 70-3 is fixed to about the specified electric potential.

Here, reference symbol Vf designates a forward voltage of the rectifying device. When the rectifying device is realized in the form of a field effect transistor having a gate and a drain connected to each other, the forward voltage Vf becomes a gate threshold voltage Vth$43+\Delta V$ of the insulated gate field effect transistor. $\Delta V$ is an increase amount in gate to source voltage corresponding to the current caused to flow through the resistor 52.

When the electric potential of the drain region changes from VH to Vs1 in Embodiment 3 of the bias circuit, if this change is higher than that based on a time constant depending on a parasitic capacitance of the node 70-3 and the resistance value of the resistor 52, the rectifying device 43 becomes transiently the cut-off state, and hence a delay is forced to occur in a change of the bias electric potential supplied from the node 70-3. This situation is undesirable. In order to improve this undesirable state, a capacitive element can be connected between the series connection termination 70-1 on the rectifying device side and the node 70-3.

This case becomes topologically equivalent to a case where a capacitive element is connected between the drain region to which the series connection termination 70-1 is connected and the division gate nearest the drain region to which the node 70-3 is connected.

Figure 7:
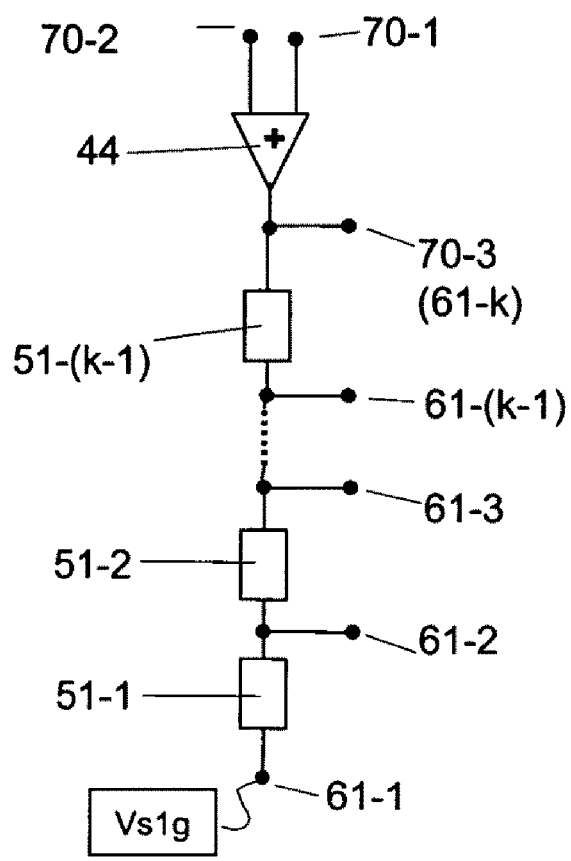
FIG. 7 is a schematic circuit diagram showing Embodiment 4 of a bias circuit of the present invention.

FIG. 7 shows Embodiment 4 of a bias circuit for dividing the output of the bias circuit of Embodiment 1 to supply the resultant electric potentials to the division gates of the high voltage operating field effect transistor of the present invention, respectively. One end of a first group of plural serial-connected resistors 51-1, 51-2, ..., 51-(k-1) is connected to the output terminal 70-3 of the bias circuit of Embodiment 1, and the specified electric potential Vs1g is supplied to the other end thereof.

The bias electric potentials are obtained from the places suitably selected from serial nodes 61-2, 61-3, ..., 61-(k-1), and a series connection termination 61-k(70-3) to be supplied to the division gates, respectively.

When the first constant electric potential Vs1 is supplied to the division gate which is located on the drain side with respect to the division gate which is adjacent thereto and nearest the source region, if the number of division gates is assigned k, the connection number of resistors belonging to a first group of plural serial-connected resistors becomes (k−2), and the first constant electric potential Vs1 is supplied to the other end thereof.

Figure 8:
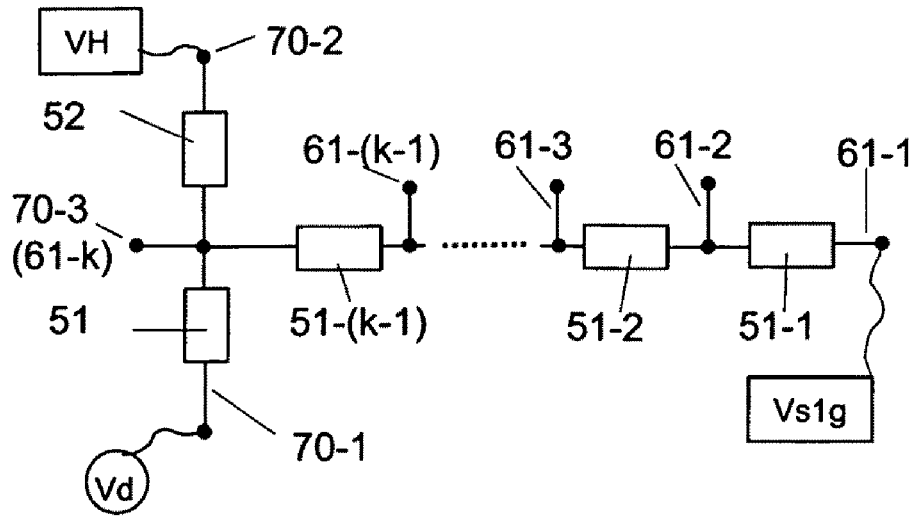
FIG. 8 is a schematic circuit diagram showing Embodiment 5 of a bias circuit of the present invention.

FIG. 8 shows Embodiment 5 of a bias circuit for dividing the output of Embodiment 2 of the bias circuit to supply the resultant electric potentials to the division gates of the high voltage operating field effect transistor of the present invention, respectively. One end of a first group of plural serial-connected resistors 51-1, 51-2, ..., 51-(k-1) is connected to the output terminal 70-3 of the bias circuit of Embodiment 2, and the specified electric potential Vs1g is supplied to the other end thereof.

The bias electric potentials are obtained from the places suitably selected from serial nodes 61-2, 61-3, ..., 61-(k-1), and a series connection termination 61-k(70-3) to be supplied to the division gates, respectively.

When the first constant electric potential Vs1 is supplied to the division gate which is located on the drain side with respect to the division gate which is adjacent thereto and nearest the source region, if the number of division gates is assigned k, the connection number of resistors belonging to a first group of plural serial-connected resistors becomes (k−2), and the first constant electric potential Vs1 is supplied to the other end thereof.

Figure 9:
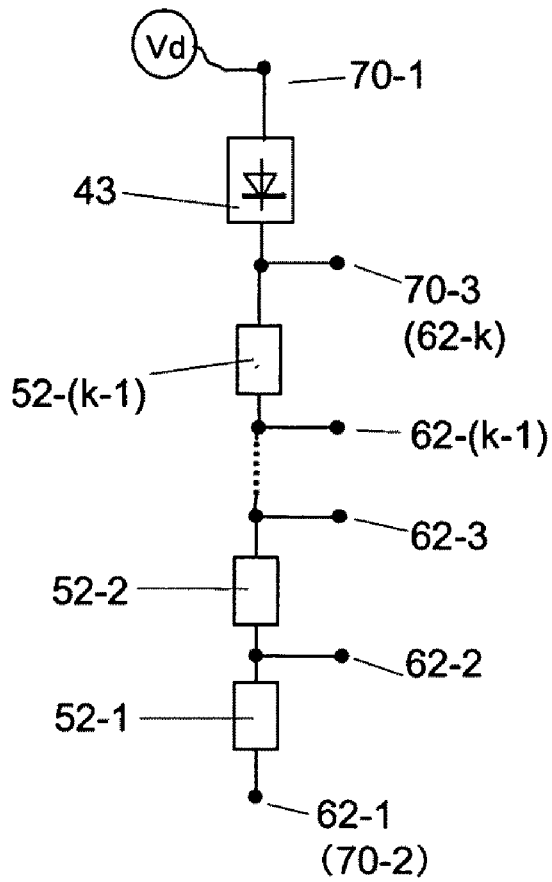
FIG. 9 is a schematic circuit diagram showing Embodiment 6 of a bias circuit of the present invention.

FIG. 9 shows Embodiment 6 of a bias circuit for dividing the output of Embodiment 3 of the bias circuit to supply the resultant electric potentials to the division gates of the high voltage operating field effect transistor of the present invention, respectively. One end of the rectifying device 43 is connected to one end of a second group of plural serial-connected resistors 52-1, 52-2, ..., 52-(k-1), and the specified electric potential Vs1g is supplied to the other end thereof. The other end of the rectifying device 43 is connected to the drain of the high voltage operating field effect transistor of the present invention.

The electric potentials are obtained from the places suitably selected from serial nodes 62-2, 62-3, ..., 62-(k-1) and a series connection end 62-k(70-3) to be supplied to the division gates, respectively.

When the first constant electric potential Vs1 is supplied to the division gate which is located on the drain side with respect to the division gate which is adjacent thereto and nearest the source region, if the number of division gates is assigned k, the connection number of resistors belonging to a first group of plural serial-connected resistors becomes k−2, and the first constant electric potential Vs1 is supplied to the other end thereof.

The following circuit configuration can be adopted as one element of a high voltage operating circuit to which the high voltage operating field effect transistor of the present invention is applied. That is, a high voltage operating circuit element including at least:

a first insulated gate field effect transistor;

a second field effect transistor complementary to the first insulated gate field effect transistor;

a first resistor having one end connected to a drain region of the first insulated gate field effect transistor; and a second resistor having one end connected to a source region of the first insulated gate field effect transistor, in which a first electric potential is supplied to the other end of the first resistor, and a second electric potential is supplied to the other end of the second resistor; the second field effect transistor is the high voltage operating field effect transistor of the present invention, and includes at least two division gates; a source of the second field effect transistor is connected to the drain of the first insulated gate field effect transistor; a division gate nearest a source region of the second field effect transistor is connected to the source of the first insulated gate field effect transistor; the second electric potential is supplied to a division gate nearest a drain region of the second field effect transistor; a gate of the first insulated gate field effect transistor is set as an input; and an output is taken out from one place selected from the source and the drain of the first insulated gate field effect transistor.

The following circuit configuration can be adopted as another element of a high voltage operating circuit to which the high voltage operating field effect transistor of the present invention is applied. That is, a high voltage operating circuit element including at least:

a first insulated gate field effect transistor;

a second field effect transistor complementary to the first insulated gate field effect transistor;

a first resistor having one end connected to a drain of the first insulated gate field effect transistor; and a second group of plural serial-connected resistors having one end of a series connection end portion connected to a source of the first insulated gate field effect transistor, in which: the second field effect transistor is the high voltage operating field effect transistor of the present invention, and includes at least three division gates; a source of the second field effect transistor is connected to the drain of the first insulated gate field effect transistor; the division gates are connected to places selected from nodes and one end of the series connection end portion of the second group of plural serial-connected resistors, respectively; the other end of the first resistor is connected to a first electric potential; a second electric potential is supplied to the other end of the series connection end portion of the second group of plural serial-connected resistors; a gate of the first insulated gate field effect transistor is set as an input; and an output is taken out from one place selected from the source and the drain of the first insulated gate field effect transistor, and the nodes of the second group of plural serial-connected resistors.

Figure 10:
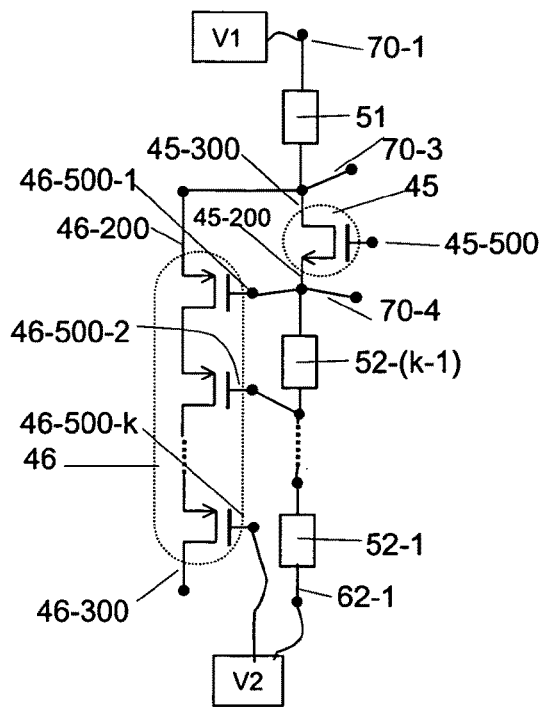
FIG. 10 is a schematic circuit diagram explaining connection of a high voltage operating circuit element of the present invention.

FIG. 10 shows a circuit diagram explaining connection of the high voltage operating circuit element of the present invention. In FIG. 10, reference numeral 51 designates the first resistor, reference numerals 52-1, . . . , 52-(k−1) designate the second group of plural serial-connected resistors, reference numeral 45 designates the first insulated gate field effect transistor, and reference numerals 45-200, 45-300, and 45-500 designate the source, the drain, and the gate of the first insulated gate field effect transistor 45, respectively. Reference numeral 46 designates the second field effect transistor, referenced numerals 46-200 and 46-300 designate the source and the drain of the second field effect transistor (high voltage operating field effect transistor), respectively, and reference numerals 46-500-1, 46-500-2, . . . , 46-500-k designate a division gate nearest the source region, a division gate located on the drain region side with respect to the division gate 46-500-1 which is adjacent thereto and nearest the source region, . . . , and a division gate nearest the drain region, respectively.

The division gate 46-500-1 nearest the source region of the second field effect transistor 46 is connected to the source 45-200 of the first insulated gate field effect transistor 45, and the source 46-200 of the second field effect transistor 46 is connected to the drain 45-300 of the first insulated gate field effect transistor 45. This connection controls a source to drain voltage of the first insulated gate field effect transistor 45 to (Vth46+ΔV) (its definition will be described below) to make the first insulated gate field effect transistor 45 to avoid from the high withstand voltage operation.

One end of the first resistor 51 is connected to the drain 45-300 of the first insulated gate field effect transistor 45, and a node between the first resistor 51 and the first insulated gate field effect transistor 45 becomes an output 70-3. One end of the second group of plural serial-connected transistors is connected to the source 45-200 of the first insulated gate field effect transistor 45, and becomes an output 70-4. A first electric potential V1 is supplied to the other end 70-1 of the first resistor 51, and a second electric potential V2 is supplied to the other end 62-1 of the second group of plural serial-connected resistors. The second electric potential V2 is also supplied to the division gate 46-500-k nearest the drain region of the second field effect transistor 46. The electric potentials which are obtained from the places suitably selected from the nodes of the second group of plural serial-connected resistors, and one end thereof are supplied to the other division gates, respectively.

When the second field effect transistor has two division gates, the second group of plural serial-connected resistors can be replaced with a single second resistor.

As examples of modification of the above-mentioned high voltage operating circuit element, there are provided:

a high voltage operating circuit element in which at least one of the first and second resistors is made a plurality of serial-connected resistors, and a node between them is made an output;

a high voltage operating circuit element in which the first resistor is made a plurality of serial-connected resistors, and the source of the second field effect transistor is connected to a node between them;

a high voltage operating circuit element in which the second resistor is made a plurality of serial-connected resistors, and the drain of the second field effect transistor is connected to a node between them;

a high voltage operating circuit element in which the drain of the second field effect transistor is connected to a second electric potential;

a high voltage operating circuit element in which the drain of the second field effect transistor is connected to a second electric potential through a third resistor;

a high voltage operating circuit element in which the drain of the second field effect transistor is connected to a third electric potential;

a high voltage operating circuit element in which the drain of the second field effect transistor is connected to a third electric potential through a third resistor; and a high voltage operating circuit element in which one of the first and second resistors is made a constant current element.

In addition thereto, the circuit element in which a person skilled in the art adds or modifies an element within the normal technical scope is included in the scope of a right of the present invention.

An offset of a gate threshold voltage Vth46 plus ΔV of the first insulated gate field effect transistor occurs between an input and a source output of the first insulated gate field effect transistor of the high voltage operating circuit element. In order to reduce the offset, the first insulated gate field effect transistor can be made a field effect transistor of a depletion type. Here, ΔV is an additionally necessary voltage drop across the gate and the source of the first insulated gate field effect transistor corresponding to a current flowing through the second resistor.

When, in the high voltage operating circuit element, the gate threshold voltage of the first insulated gate field effect transistor and the gate threshold voltage of the second field effect transistor are nearly equal in absolute value to each other, the offset occurring between the input and the drain output of the first insulated gate field effect transistor is nearly compensated for.

In Embodiment 2 of the bias circuit, the current from the bias circuit is caused to flow into the drain of the high voltage operating field effect transistor of the present invention. In addition, in the bias circuit of Embodiment 3, the resistor of the bias circuit is added in parallel with the drain output resistor of the high voltage operating field effect transistor of the present invention. When those matters become a problem in terms of the performance or the product image, an insulated gate field effect transistor is introduced into the bias circuit, and a drain voltage is inputted to its gate, thereby solving this problem. The high voltage operating circuit element can be utilized in the pivot of this bias circuit.

Figure 11:
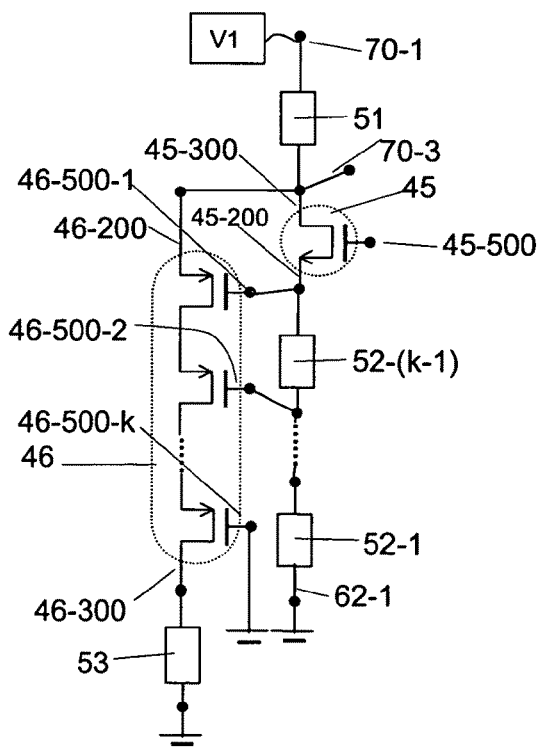
FIG. 11 is a schematic circuit diagram showing Embodiment 7 of a bias circuit of the present invention.
Figure 1:
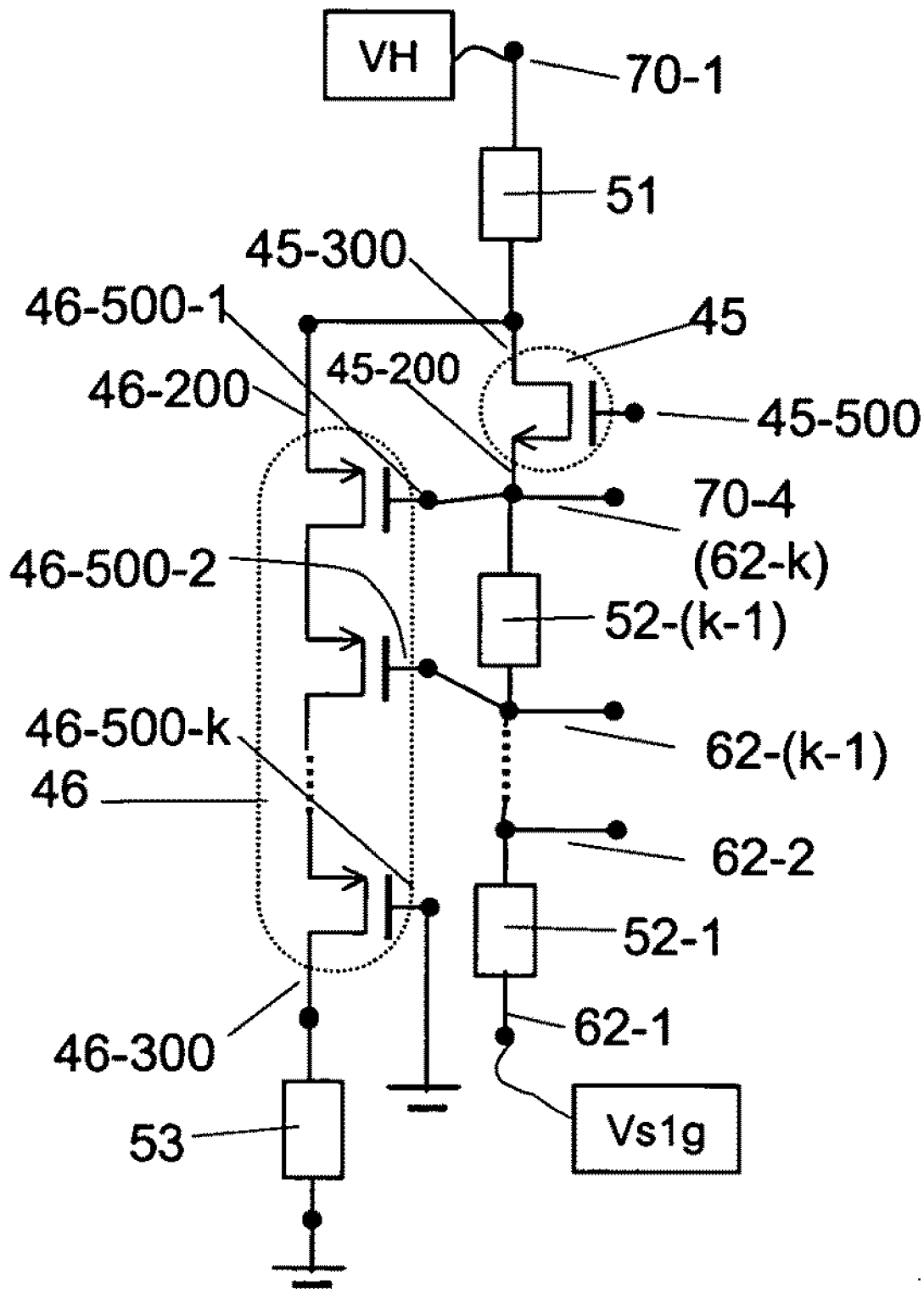

Embodiment 7 of a bias circuit utilizing the high voltage operating circuit element will hereinafter be described. That is, as in its example shown in FIG. 11, in the high voltage operating circuit element shown in FIG. 10, the first electric potential is made a high voltage power supply electric potential VH, the second electric potential is made the grounding electric potential, and the grounding electric potential is supplied to the drain of the second field effect transistor 46 through a third resistor 53.

The gate 45-500 of the first insulated gate field effect transistor 45 is connected to the drain of the high voltage operating field effect transistor of the present invention, and the bias electric potential is supplied from the node 70-3 between the drain 45-300 of the first insulated gate field effect transistor 45 and the first resistor 51 to the division gate nearest the drain region of the high voltage operating field effect transistor of the present invention or the gate of Modification 1 of Embodiment 2.

If a resistance value of the third resistor 53 is expressed by (a resistance value of the first resistor)×(Vs1)/(VH−Vs1), when the drain voltage becomes a low electric potential, the electric potential supplied to the division gate nearest the drain region or the gate of Modification 1 of Embodiment 2 does not change from Vs1 towards the grounding electric potential.

The similar effects are obtained when the other end 62-1 of the second group of plural serial-connected resistors is connected to the node between the third resistor and the drain of the second field effect transistor and a resistance value of the third resistor 53 is set to (a resistance value of the first resistor)×(Vs1−Vth46−ΔV)/(VH−Vs1). Here, (Vth46+ΔV) is a gate to source voltage required when a current expressed by (VH−Vs1)/(the resistance value of the first resistor) is caused to flow through the second field effect transistor.

The similar effects are obtained when the electric potential (Vs1−Vth46−ΔV) is supplied to the other end 62-1 of the second group of plural serial-connected resistors.

In order to supply the bias electric potentials to a plurality of division gates of the high voltage operating field effect transistor of the present invention by utilizing the output of Embodiment 7 of the bias circuit, for example, as in Embodiment 5 of the bias circuit, one end of a first group of plural serial-connected resistors is connected to the output terminal 70-3 extending from the drain 45-300 of the first insulated gate field effect transistor 45, the specified electric potential is supplied to the other end thereof, and the electric potentials are obtained from the places suitably selected from the nodes of the first group of plural serial-connected resistors and the end portions thereof to be supplied to the division gates, respectively.

When the first constant electric potential is supplied to the division gate located in the drain region side with respect to the division gate which is adjacent thereto and nearest the source region, the connection number of the first group of plural serial-connected resistors becomes k−2, and the first constant electric potential is supplied to the other end portion thereof.

Moreover, in a bias circuit of Embodiment 8 shown in FIG. 12, the bias electric potentials can be obtained from places suitably selected from nodes 62-2, ..., 62-($k$−1) of the second group of plural serial-connected resistors 52-1, ..., 52-($k$−1), and end portions 62-1 and 62-$k$ thereof to be supplied to the division gates of the high voltage operating field effect transistor of the present invention, respectively. At this time, the specified electric potential is supplied to the other end portion of the second group of plural serial-connected resistors 52-1, ..., 52-($k$−1).

When the first constant electric potential is supplied to the division gate located in the drain region side with respect to the division gate which is adjacent thereto and nearest the source region, the first constant electric potential is supplied to the other end portion thereof.

Note that when the gate of the high voltage operating field effect transistor of the present invention requiring the supply of the bias electric potentials is only one nearest the drain region, or only one gate is provided as Modification 1 of Embodiment 2 and the number of division gates of the second field effect transistor is two, the second group of plural serial-connected resistors is constituted by the single second resistor, and the bias electric potential is supplied from a node between the source of the first field effect transistor and the single second resistor to the gate.

In Embodiment 8 of the bias circuit utilizing the high voltage operating circuit element, the resistor component of the bias circuit added in parallel with the drain of the high voltage operating field effect transistor of the present invention is substantially removed from Embodiment 6 of the bias circuit.

Note that in the bias circuit of Embodiment 8, the third resistor 53 can be omitted in some above mentioned modifications.

In order to realize the resistor of the bias circuit of each of Embodiments 1 to 8 of the bias circuit of the present invention without newly adding any of the special manufacturing processes or with few modifications, it is possible to use a polycrystalline silicon resistor used in the analog MOSIC, an impurity layer formed on a substrate surface by diverting the ion implantation process for LDD or drain extension, or the like. A resistor having nearly the linear characteristics is desirably used as the resistor. However, for a low power consumption application requiring a high sheet resistor, it is possible to use a channel resistance of a field effect transistor, a semiconductor thin film formed on an insulating substrate such as an SOI substrate or a glass substrate, or an organic sheet, or the like. In this case, the resistor does not necessarily have the linear resistance characteristics.

The present invention includes a transistor a structure or a bias electric potential of which is changed within the known technical scope. Moreover, a composite transistor in which the architecture of the present invention is incorporated is also included in the scope of the present invention. In addition, the bias circuit to which, in addition to the element described in the bias circuit of the present invention, an element such as a resistor, a capacitive element, or a transistor is added so as to fall within the scope of the normal technical power is also included in the scope of the present invention.

Figure 13:
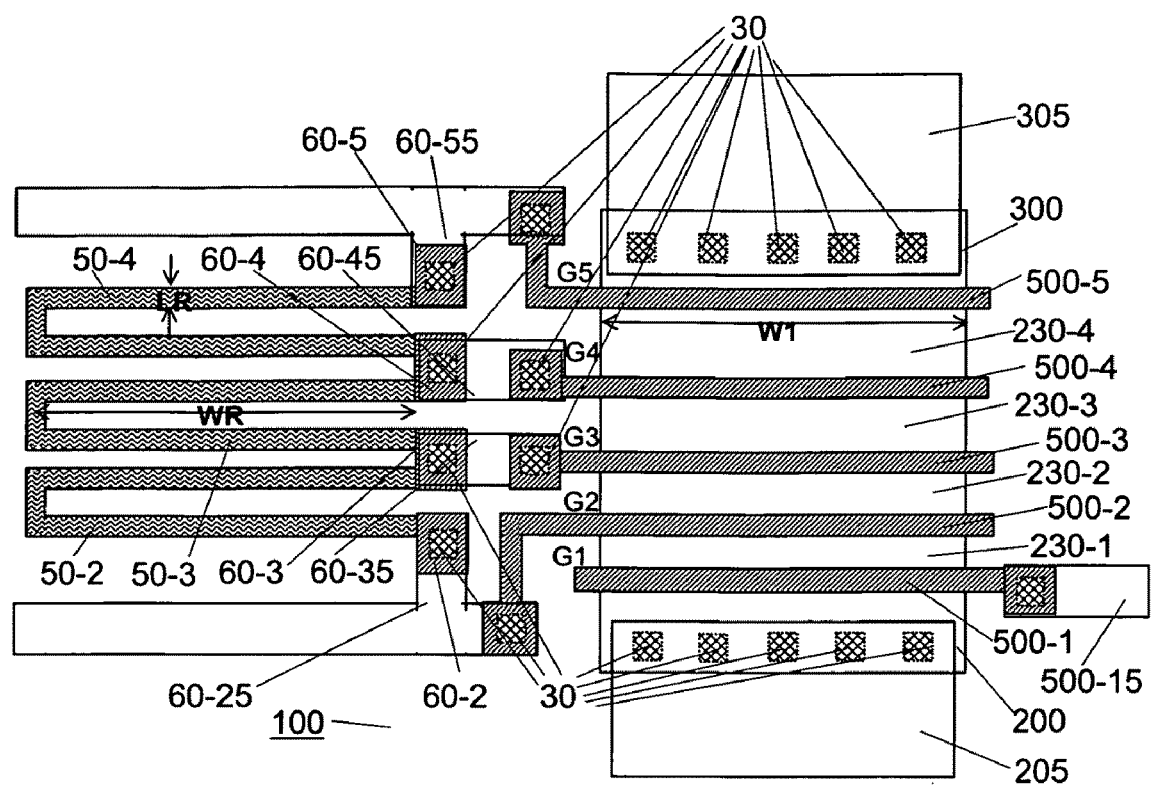
FIG. 13 is a plan view of Example 1 of the present invention.

FIG. 13 shows a plan view of a device of Example 1 of the present invention. While FIG. 13 is not a cross sectional view, for the purpose of enhancing the visual recognition of respective parts, patterns indicated by slant lines and the like are drawn in FIG. 13. In the figure, reference numeral 100 designates an SOI substrate, reference numeral 200 designates a source of a high voltage operating field effect transistor, reference numeral 300 designates a drain of the high voltage operating field effect transistor, and reference numerals 500-1, 500-2, 500-3, 500-4, and 500-5 designate division gates G1, G2, G3, G4, and G5 of the high voltage operating field effect transistor under which gate insulating films 400-1, 400-2, 400-3, 400-4, and 400-5 (not shown) are formed on the channel formation region 130 (not shown). The channel formation region 130 is divided into the division channels 130-1, 130-2, 130-3, 130-4, and 130-5 (not shown) each having a width W1 and a length Lc1 by the intermediate regions 230-1, 230-2, 230-3, and 230-4. The division channel length Lc1 is a value obtained by subtracting a transverse overlap length of the intermediate region or the source/drain region under the division gate from the division gate length Lg1.

Note that a square 30 drawn in the figure shows a contact hole.

The channel formation region 130 (not shown), the source region 200, the drain region 300, and the intermediate region 230 (230-1, 230-2, 230-3, and 230-4) are formed in the semiconductor thin film in the surface of the SOI substrate 100. Each of the source region 200, the drain region 300, and the intermediate region 230 is a high impurity concentration region accompanied with an extension region having a reduced impurity concentration. Phosphorus or arsenic is used as the impurity for an n-channel high voltage operating field effect transistor, and boron is used as the impurity for a p-channel high voltage operating field effect transistor.

Reference numerals 50-2, 50-3, and 50-4 designate resistors for electric potential division. The semiconductor thin film in the surface of the SOI substrate 100 is processed into a shape having a width LR and a length of about 2 WR to be left behind, while the periphery of the resistors is turned to oxide, thereby obtaining the resistors 50-2, 50-3, and 50-4 for electric potential division. Also, the resistors 50-2, 50-3, and 50-4 are realized by adding the same impurity as that in the case of the extension dope or the channel dope. In order to form the nodes 60-2, 60-3, and 60-4, the high concentration impurities for the source/drain formation are added to the portions to be formed as the nodes. The conductivity type of the impurities added to the resistors for the electric potential division is desirably the conductivity type opposite to that of the impurities added to the source/drain region of the high voltage operating field effect transistor of the present invention.

In the figure, reference numeral 30 designates a contact hole, reference numeral 60-25 designates an interconnection supplying an electric potential and extending from the node 60-2 to the division gate 500-2, reference numeral 60-35 designates an interconnection from the node 60-3 to the division gate 500-3, reference numeral 60-45 designates an interconnection from the node 60-4 to the division gate 500-4, reference numeral 60-55 designates an interconnection supplying an electric potential from the node 60-5 to the division gate 500-5, reference numeral 205 designates a source lead electrode, reference numeral 305 designates a drain lead electrode, and reference numeral 500-15 designates a lead electrode from the division gate 500-1.

The high voltage operating field effect transistor of Example 1 having the above-mentioned structure was experimentally fabricated in a SOI substrate.

The high voltage operating field effect transistor experimentally fabricated has five division gates each having a gate length of Lg1=0.8 μm and a gate width of W1=80 μm, and also has an $SiO_2$ film having a thickness of 11 nm as the gate insulating film. Each of the resistors 50-1, 50-2, and 50-3 is formed in size ratio of length/width=80 μm/2.4 μm. The SOI substrate is constituted by a silicon thin film with 100 nm thickness, an $SiO_2$ thin film with 100 nm thickness, and a silicon substrate.

Figure 14:
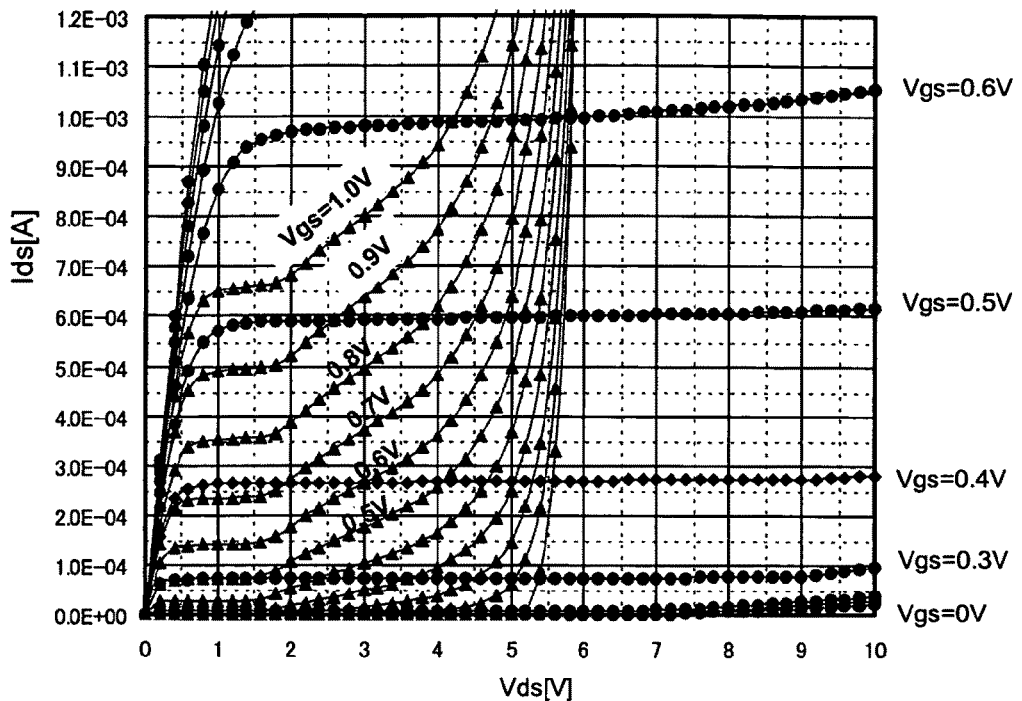
FIG. 14 is a graphical representation comparing measurement results of output characteristics of an experimental sample of an n-channel high voltage operating field effect transistor of Example 1 with those of a conventional long channel MOS transistor.

The output characteristics when Vg is supplied to the division gate 500-1(G1), Vs1=1 V is supplied to the division gate 500-2(G2), Vs1=1 V is supplied to the node 60-2, and Vd+Vs1=Vd+1 V is supplied to the node 60-5 are shown in FIG. 14 by curves with black circles or black triangles.

For comparison with the output characteristics of the high voltage operating field effect transistor of the present invention, the output characteristics of a conventional standard MOS transistor which is formed on the same substrate which has a gate length of 4 μm and a gate width of 80 μm are shown in the figures by curves with black triangles. The reason that the gate length of 4 μm is selected for the conventional standard MOS transistor is that this gate length corresponds to a total gate length of the five division gates of the high voltage operating field effect transistor of the present invention. Since the channel length of the conventional standard MOS transistor as a comparative example is longer than the total value of the lengths of the five division channels of the high voltage operating field effect transistor of the present invention, this comparative example of the conventional type is advantageous from a viewpoint of an average electric field.

FIG. 14 shows the output characteristics of the experimentally fabricated n-channel high voltage operating field effect transistor.

In the case of the conventional MOS transistor as the comparative example, the current Ids starts to abruptly increase at Vds a little less than 2 V. However, in the case of the high voltage operating field effect transistor of the present invention, no abrupt increase of the current Ids is observed even at Vds=10 V. In addition, the current value at Vgs=0.6 V of the high voltage operating field effect transistor of the present invention is about 7 times as large as that of the MOS transistor as the comparative example.

FIG. 14 shows that the withstand voltage is remarkably improved as compared with the improvement in the withstand voltage of the MOS transistor by the simple increase in channel length, and the large current driving ability is held.

Figure 15:
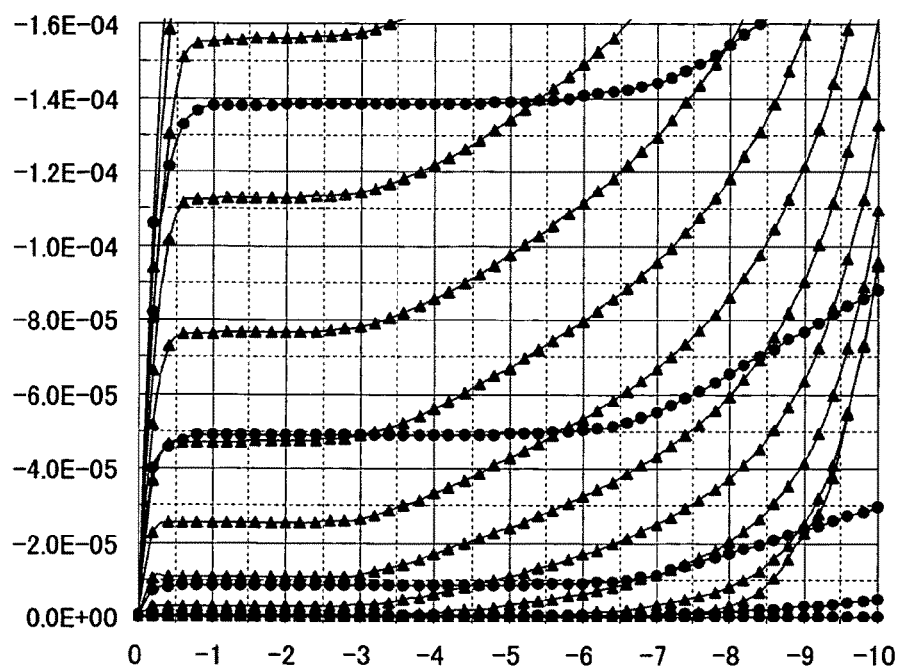
FIG. 15 is a graphical representation comparing measurement results of output characteristics of an experimental sample of a p-channel high voltage operating field effect transistor of Example 1 with those of a conventional long channel MOS transistor.

FIG. 15 shows the output characteristics of an experimentally fabricated p-channel high voltage operating field effect transistor.

In the case of the conventional MOS transistor as a comparative example, a current Ids starts to abruptly increase at Vds=−3 V. However, in the case of the high voltage operating field effect transistor of the present invention, though an increase in the current Ids is observed at Vds=−7 V, the withstand voltage of Vds at Vgs=0 V is equal to or larger than 10 V. In addition, the current value at Vgs=−0.6 V of the high voltage operating field effect transistor of the present invention is about 9 times as large as that of the conventional MOS transistor as the comparative example.

FIG. 15 shows that the withstand voltage is remarkably improved as compared with the improvement in the withstand voltage of the MOS transistor by the simple increase in channel length, and the large current driving ability is held.

Figure 16:
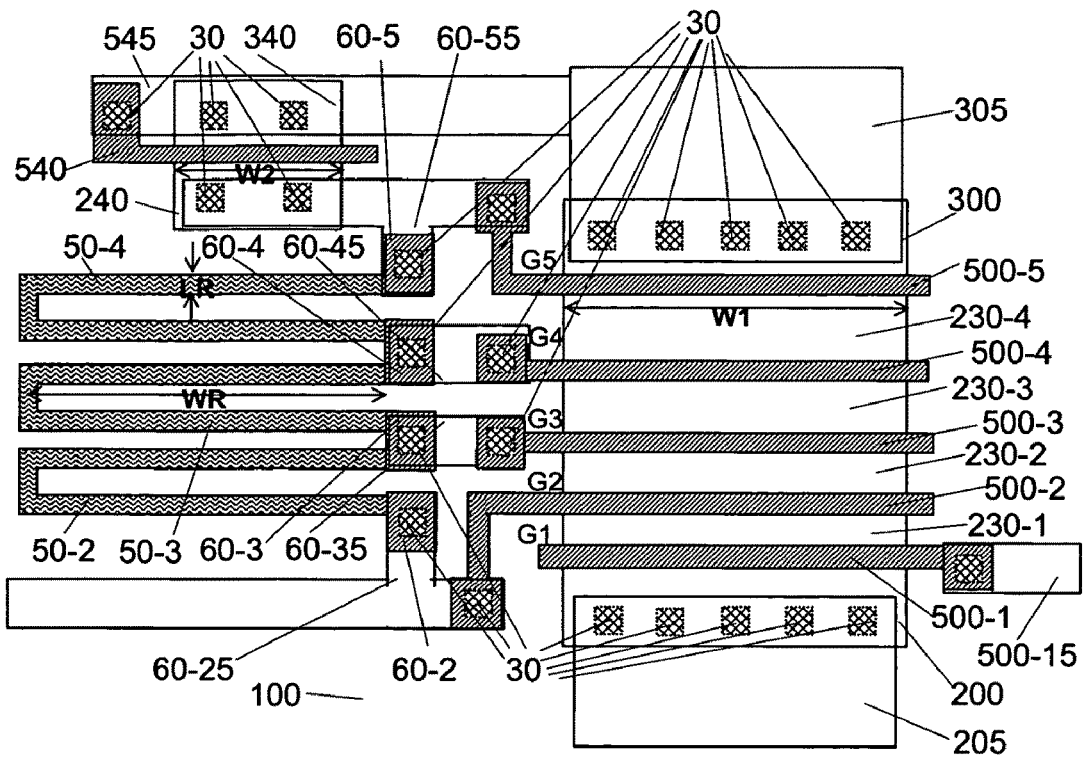
FIG. 16 is a plan view of Example 2 of the present invention.

FIG. 16 shows a plan view of a device of Example 2 of the present invention. While FIG. 16 is not a cross sectional view, for the purpose of enhancing the visual recognition of respective parts, patterns indicated by slant lines and the like are drawn in FIG. 16.

In Example 2, a bias circuit corresponding to Embodiment 6 of the bias circuit is used. A MOS transistor 43 in which a gate 540 and a drain 340 are connected to each other through an interconnection 545 is used as a rectifying device. A source 240 of the MOS transistor 43 is connected in series with a resistor 50-4 through an interconnection 60-55. The drain 340 of the MOS transistor 43 is connected to the drain of the high voltage operating field effect transistor of the present invention through the interconnection 545. Other elements and connection are the same as those of Example 1.

Figure 17:
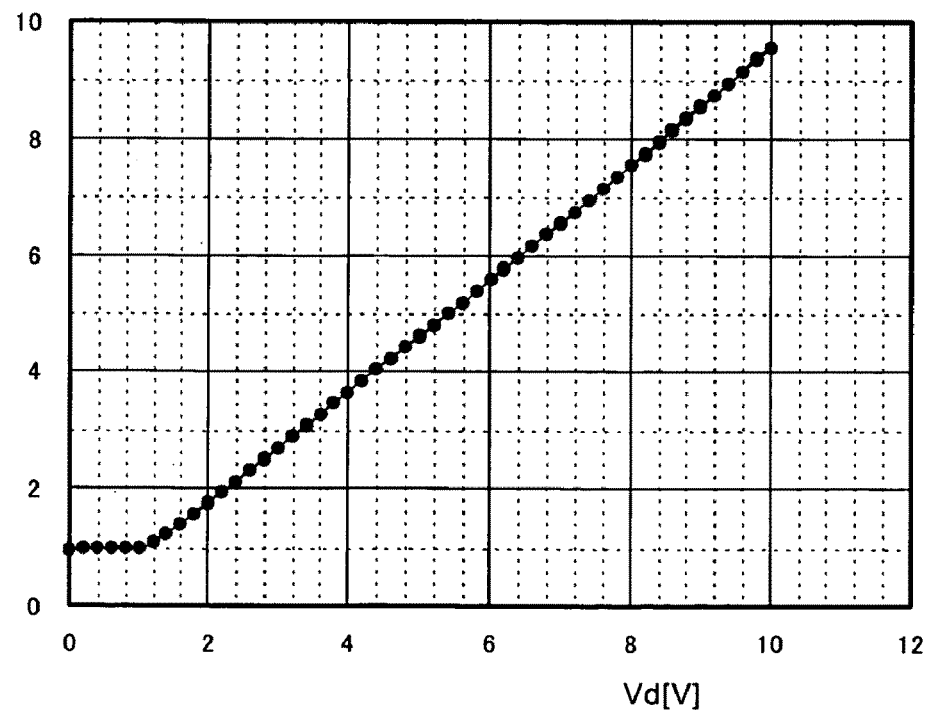
FIG. 17 is a graphical representation showing voltage transfer characteristics of a bias circuit of Example 2.

A relationship between a drain electric potential Vd and an electric potential V5 at the node 60-5, when the first constant electric potential Vs1 is 1 V, shows the characteristics shown in FIG. 17. When Vd becomes equal to or lower than Vs1, the electric potential V5 at the node 60-5 is held at a potential slightly higher than Vs1=1 V. The electric potential at each of the nodes 60-2, 60-3, 60-4, and 60-5 does not become equal to or lower than the first constant electric potential Vs1 of the node 60-2 owing to the function of the MOS transistor 43 as a rectifying device. Thus, each of V2, V3, V4, and V5 does not become equal to or lower than the electric potential Vs1. For this reason, even in a region in which Vd is low, the output current of the high voltage operating field effect transistor of the present invention is held.

Figure 18:
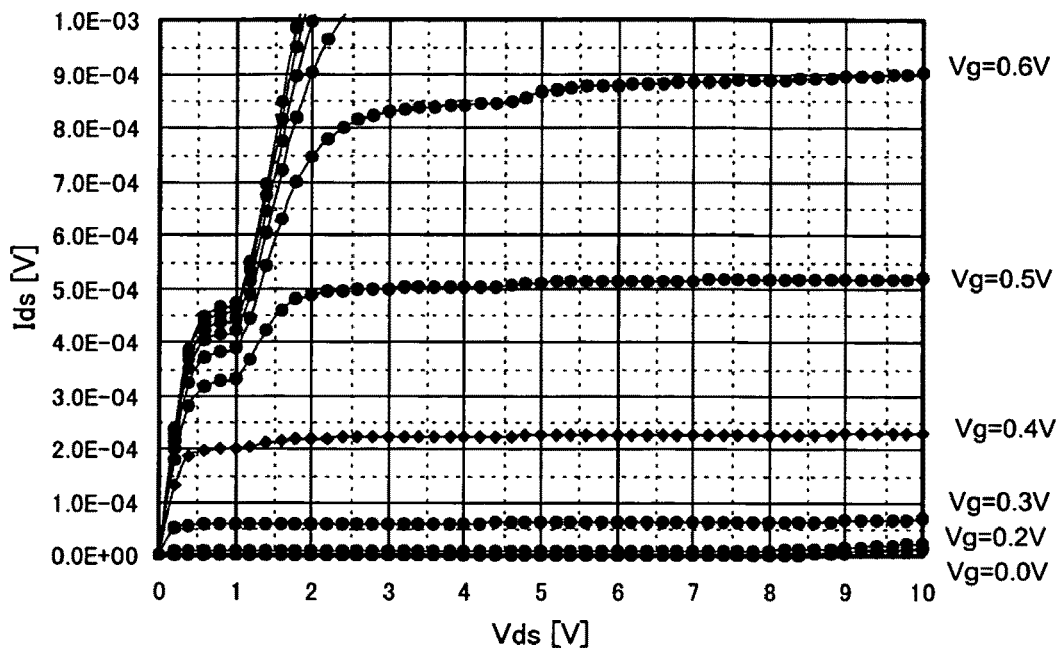
FIG. 18 is a graphical representation showing measurement results of output characteristics of an experimental sample of an n-channel high voltage operating field effect transistor of Example 2.

FIG. 18 shows the output characteristics of an experimentally fabricated n-channel high voltage operating field effect transistor. In the case of the p-channel high voltage operating field effect transistor of the present invention, for Vds at least up to 10 V, no sudden increase in the current Ids is observed. A drain current at Vg=0 V increases by about 150 nA owing to the influence of direct connection of the bias circuit to the drain. Since this is not a leakage current due to the degradation of the device, there is no anxiety in terms of reliability. In addition, "bumps" appear in the vicinity of Vds≈1 V in the V-I characteristics. However, the appearance of the bumps is due to the fact that the division gate biases are controlled so as to be fixed in the range of Vd<≈1 V, and hence is not due to the degradation of the withstand voltage.

In a low voltage region in which Vds is equal to or lower than 1 V, when Vg=0.6 V, the current driving ability of the n-channel high voltage operating field effect transistor of the present invention is about 3 times as large as that of the MOS transistor as the comparative example. When Vds becomes a high voltage, the same magnification as that in Example 1 is obtained.

Figure 19:
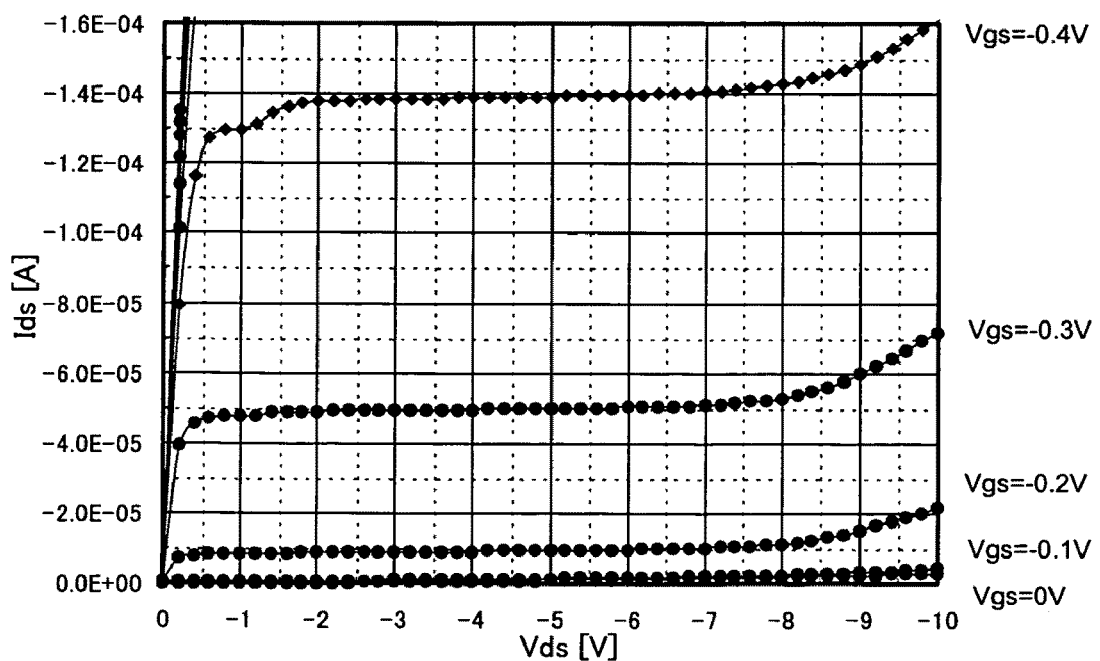
FIG. 19 is a graphical representation showing measurement results of output characteristics of an experimental sample of a p-channel high voltage operating field effect transistor of Example 2.

FIG. 19 shows the output characteristics of an experimentally fabricated p-channel high voltage operating field effect transistor. In the p-channel high voltage operating field effect transistor of the present invention, though when |Vds| is equal to or higher than 8 V, an increase in the current Ids is observed, the absolute value of the withstand voltage of Vds at Vgs=0 V is equal to or higher than 10 V. Since the bias circuit is directly connected to the drain, a drain output resistance of about 4 MΩ appears to be connected in parallel. However, since this is not a leakage current due to the degradation of the device, there is no anxiety in terms of reliability. In addition, "a small bump" appears in the vicinity of Vds≈−1 V in the V-I characteristics. However, the appearance of the bump is due to the fact that the division gate biases are controlled so as to be fixed in the range of |Vd|<≈1 V, and hence is not due to the degradation of the withstand voltage. When |Vds| becomes a high voltage, the same magnification as that in Example 1 is obtained.

In a low voltage region in which |Vds| is equal to or lower than 1 V, when Vgs=−0.6 V, the current driving ability of the p-channel high voltage operating field effect transistor of the present invention is about 5 times as large as that of the MOS transistor as the comparative example.

While Examples 1 and 2 described above are examples of the field effect transistors each formed in the SOI substrate for which the increased withstand voltage has been regarded as being difficult, the same effects can be obtained even in a field effect transistor formed in an SON or a semiconductor substrate.

The present invention includes a transistor an architecture or bias electric potentials of which are changed from the above description for the present invention within the normal technical scope. Moreover, a transistor in which the architecture of the present invention is incorporated is also included in the scope of the present invention. In addition, a bias circuit to which, in addition to the elements described in the bias circuits of the present invention, an element such as a resistor or a capacitive element is added so as to fall within the normal technical scope is also included in the scope of the present invention.

What is claimed is:

1. A method of high voltage operation of a field effect transistor, comprising:
   providing a field effect transistor that includes a substrate, a source region and a drain region spaced apart from each other in a surface of the substrate, a semiconductor channel formation region disposed in the surface of the substrate between the source region and the drain region, a gate region disposed above the channel formation region, and a gate insulating film region disposed between the channel formation region and the gate region;
   supplying at least one of a signal electric potential and a signal current to the source region of the field effect transistor; and
   supplying to the gate region of the field effect transistor a bias electric potential having an absolute value equal to or larger than a first constant electric potential which changes according to an increase or decrease in a drain electric potential.

2. A method according to claim 1; wherein the providing step comprises providing a capacitive element connected between the drain region and the gate region.

3. A method according to claim 1; wherein in the providing step, the substrate comprises a semiconductor substrate.

4. A method according to claim 1; wherein in the providing step, the substrate comprises a semiconductor thin film disposed on a surface of a supporting substrate and insulated from the supporting substrate.

5. A method of high voltage operation of a field effect transistor, comprising:
   providing a field effect transistor that includes a substrate, a source region and a drain region spaced apart from each other in a surface of the substrate, a semiconductor channel formation region disposed in the surface of the substrate between the source region and the drain region, a gate region disposed above the channel formation region, and a gate insulating film region disposed between the channel formation region and the gate region;

providing a bias circuit comprised of two serial-connected resistors having a first end connected to the drain region and a second end;
supplying at least one of a signal electric potential and a signal current to the source region of the field effect transistor;
supplying to the gate region of the field effect transistor a bias electric potential having an absolute value equal to or larger than a first constant electric potential which changes according to an increase or decrease in a drain electric potential;
supplying to the second end of the two serial-connected resistors an electric potential of a high voltage power supply; and
supplying a bias electric potential from a node between the two serial-connected resistors to the gate region.

6. A method of high voltage operation of a field effect transistor, comprising:
providing a field effect transistor that includes a substrate, a source region and a drain region spaced apart from each other in a surface of the substrate, a semiconductor channel formation region disposed in the surface of the substrate between the source region and the drain region, a gate region disposed above the channel formation region, and a gate insulating film region disposed between the channel formation region and the gate region;
providing a bias circuit comprised of a rectifying device having one side connected in series to the drain region, and a resistor connected to the rectifying device;
supplying at least one of a signal electric potential and a signal current to the source region of the field effect transistor;
supplying to the gate region of the field effect transistor a bias electric potential having an absolute value equal to or larger than a first constant electric potential which changes according to an increase or decrease in a drain electric potential;
supplying a first constant electric potential to a side of the resistor; and
supplying a bias electric potential from a node between the rectifying device and the resistor to the gate region.

* * * * *